United States Patent [19]

O'Connell

[11] 4,232,240
[45] Nov. 4, 1980

[54] HIGH PIEZOELECTRIC COUPLING X-CUTS OF LEAD POTASSIUM NIOBATE, $PB_2KNB_5O_{15}$, FOR SURFACE ACOUSTIC WAVE APPLICATIONS

[75] Inventor: Robert M. O'Connell, Arlington, Mass.

[73] Assignee: The United States of America as represented by the Secretary of the Air Force, Washington, D.C.

[21] Appl. No.: 43,982

[22] Filed: May 31, 1979

[51] Int. Cl.³ .................................. H01L 41/18
[52] U.S. Cl. ...................... 310/313 A; 310/360
[58] Field of Search ............. 310/360, 313; 333/193, 333/150, 154

[56] References Cited

U.S. PATENT DOCUMENTS

| | | | |
|---|---|---|---|
| 4,001,767 | 1/1977 | Slobodnik, Jr. et al. | 310/360 |
| 4,109,172 | 8/1978 | O'Connell | 310/313 |
| 4,109,173 | 8/1978 | O'Connell | 310/313 |

OTHER PUBLICATIONS

Strong Electromechanical Coupling of SAW on a $Pb_2KNb_2O_{15}$ Single Crystal by H. Yamauchi, Applied Physics Letters 32(10), May 15, 1978.

Primary Examiner—Mark O. Budd
Attorney, Agent, or Firm—Joseph E. Rusz; William J. O'Brien

[57] ABSTRACT

A series of lead potassium niobate substrates having X-cut crystallographic orientations defined by the Euler Angles Lambda=90.0°, Mu=90.0° and Theta from —10.6° to +10.6°.

3 Claims, 2 Drawing Figures

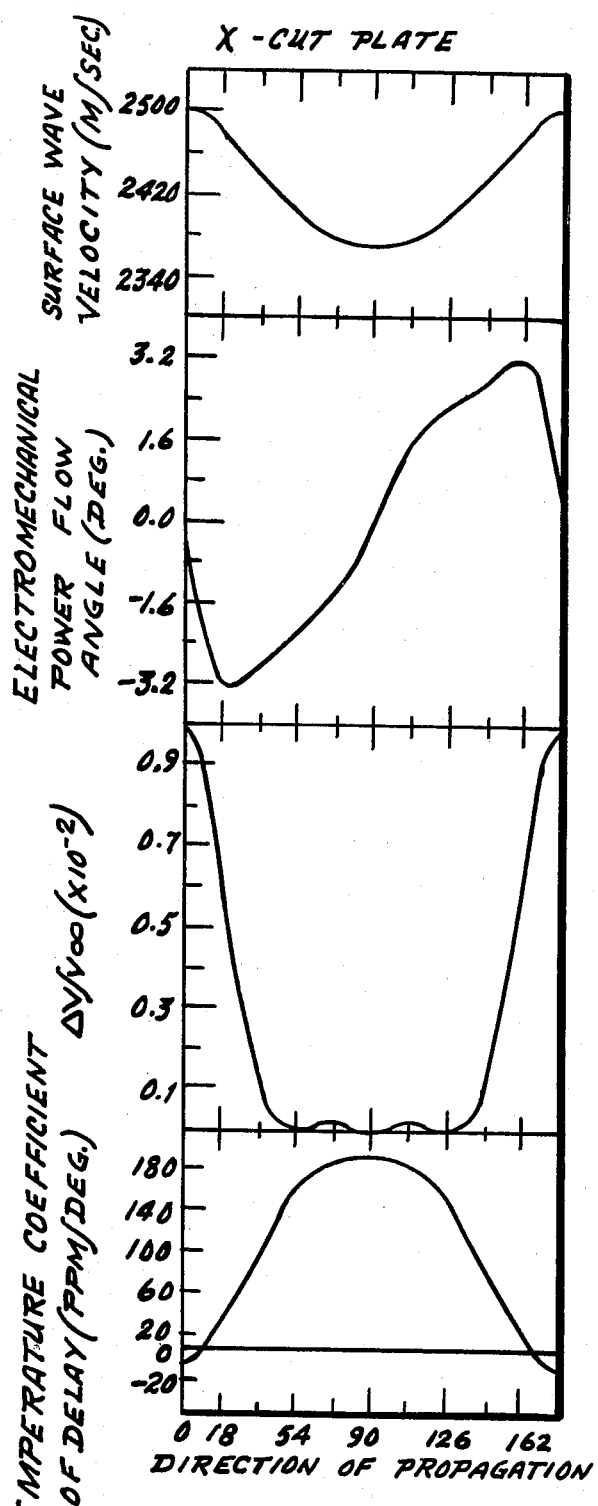
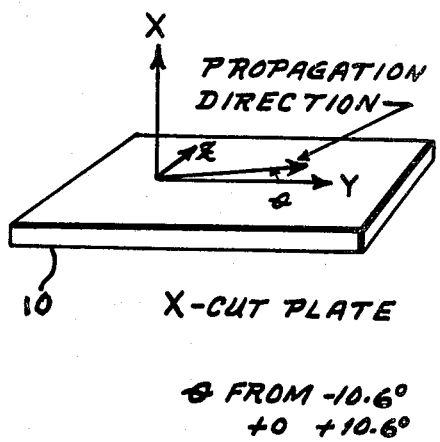
FIG. 1
FIG. 2

HIGH PIEZOELECTRIC COUPLING X-CUTS OF LEAD POTASSIUM NIOBATE, PB$_2$KNB$_5$O$_{15}$, FOR SURFACE ACOUSTIC WAVE APPLICATIONS

STATEMENT OF GOVERNMENT INTEREST

The invention described herein may be manufactured and used by or for the Government for governmental purposes without the payment of any royalty thereon.

BACKGROUND OF THE INVENTION

This invention relates to surface acoustic wave devices and to substrates of lead potassium niobate, Pb$_2$KNb$_5$O$_{15}$, PKN) for use therewith.

ST-cut quartz is often utilized as a piezoelectric substrate material for a wide variety of surface acoustic wave devices (SAW) such as filters, delay time encoders, decoders, correlators and other signal processing devices. Unfortunately, ST-cut quartz possesses a low piezoelectric coupling constant and, therefore, is not suitable for use in SAW devices designed to have low insertion losses and broad bandwidths. As a consequence, a considerable research effort has evolved in an attempt to find other materials for use as SAW substrates that are temperature compensated and possess a requisite high piezoelectric coupling constant. In attempting to find desirable materials, it was determined that, in order to be temperature compensated, the material often possesses either a positive temperature coefficient of an elastic constant or a negative coefficient of thermal expansion. That such a concept is valid has been demonstrated by the results of recent calculations of the SAW properties of berlinite (which has a positive temperature coefficient of an elastic constant) and $\beta$-eucryptite (which has a negative coefficient of thermal expansion). Those calculations showed that both materials are indeed temperature compensated and have larger piezoelectric coupling constants than ST-cut quartz.

However, berlinite and $\beta$-eucryptite still fail to possess a piezoelectric constant as large as is desired for certain SAW applications and, in addition, lack the low temperature coefficient of time delay and small electromechanical power flow angle parameters also desired for SAW applications. In further attempts at finding materials which might prove useful and desirable for SAW applications, it was discovered that lead potassium niobate (PKN), which occurs in the tungsten bronze structure and belongs to the orthorhombic crystal class mm2(C$_{2v}$) is attractive for SAW applications. The most significant feature of this material is that its piezoelectric coupling constant is up to four times as large as that of berlinite. In addition, the diffraction spreading of PKN is less than that of an isotropic material, an attractive feature not shared by either quartz or berlinite. Calculations undertaken during the research effort have shown that a continuous series of propagation directions in the plane of the X-cut of lead potassium niobate provide substrates with piezoelectric coupling constants 14.5 to 17.1 times as large as that of ST-cut quartz. The particular crystallographic orientations of this invention are defined by the Euler angles: Lambda=90.0°; Mu=90.0°; and a range of from −10.6° to +10.6° Theta.

Currently, lithium niobate (LiNbO$_3$) is used as a substrate in surface acoustic wave devices requiring greater bandwidth (for a given amount of insertion loss) than that obtainable with ST cut quartz. But because LiNbO$_3$ has a large sensitivity to temperature, bulky and costly ovens are required for temperature control. However, this new series of orientations of lead potassium niobate will make it possible to build SAW devices with far greater bandwidth than that possible with quartz, and with greater temperature stability than that possible with lithium niobate.

The most important feature of the series of orientations of this invention is that their piezoelectric coupling coefficients are from 14 to 17 times as large as that of ST-Cut quartz. This makes it possible to build low insertion-loss SAW devices with low temperature sensitivity and larger bandwidths than those obtainable in the devices currently being built on ST-cut quartz.

SUMMARY OF THE INVENTION

In accordance with the general concept of this invention it has been found that lead potassium niobate provides a desirable and efficient substrate material for surface acoustic wave (SAW) applications. Calculations of the SAW properties of the substrate material have produced a series of crystallographic orientations perpendicular to the x-axis that provide the substrate with a low temperature coefficient of time delay and a small electromechanical power flow angle particularly suitable for SAW applications. The advantages of using the substrates of this invention are achieved by crystallographic orientations which are defined by the Euler angle Lambda=90.0°, Mu=90.0° and a range of from −10.6° to +10.6° Theta.

Accordingly, the primary object of this invention is to provide a novel substrate material for use in surface acoustic wave applications.

Another object of this invention is to provide a substrate material for surface acoustic wave applications that is characterized by a low temperature coefficient of time delay and a small electromechanical power flow angle.

Still another object of this invention is to provide a substrate material for surface acoustic wave applications that possesses very high piezoelectric coupling characteristics.

The above and still other objects and advantages of the present invention will become more readily apparent upon consideration of the following detailed description thereof when viewed in conjunction with the accompanying drawings.

DESCRIPTION OF THE DRAWINGS

In the drawings

FIG. 1 is an isometric view illustrating the substrate material contemplated by this invention; and FIG. 2 is a graphical illustration showing various properties for the x-cut substrate of FIG. 1.

DETAILED DESCRIPTION OF THE PREFERRED EMBODIMENT

Pursuant to the above-defined objects, it has been found that lead potassium niobate crystalline substrates with crystallographic orientations defined by the Euler angle Lambda=90.0°, Mu=90.0° and a range of from −10.6° to +10.6° Theta are especially suitable for surface acoustic wave applications and exhibit piezoelectric coupling constants from 14 to 17 times as large as that of the previously known ST-cut quartz substrate.

Initial interest in PKN as a possible SAW substrate material was stimulated by measurements of its bulk wave properties which showed it to have electromechanical coupling factors as large as 0.73 and opposite signs for the temperature coefficients of the fundamental resonant frequencies for various crystal-cut plates. This latter result suggested that temperature-compensated cuts could be found for intermediate orientations. Further impetus was provided by the results of measurements of the temperature coefficients of the elastic constants of PKN, some of which are positive. To investigate the SAW properties of PKN, a theoretical computer model was used to calculate the SAW velocity, the electromechanical power flow angle, an estimate of the piezoelectric coupling, and the first-order temperature coefficient of time delay for singly rotated standard crystallographic orientations. As input, this model required experimental values for the elastic, piezoelectric, and dielectric constants, their respective temperature coefficients, the density, and the coefficients of thermal expansion. Values for all but one of these necessary constants were obtained from the data of Regnault, Ph.D. dissertation, (The Pennsylvania State University, 1977) (unpublished). His measurements were made on small (4–5 mm) single-crystal samples of PKN which were obtained from larger cracked boules grown from a melt by the conventional Czochralski method. The samples were homogeneous and free of internal strains but contained 180° (electrical) domains which adversely affected only the measurement of the dielectric constant; hence, for the SAW property calculations, a value for that quantity was obtained from the data of Yamada, J. Appl. Phys. 46, 2894 (1975). Note that the effect of the dielectric constants on SAW calculations is only second order in comparison to that of the elastic or piezoelectric constants.

Crystalline orientations considered attractive for SAW applications were found for single rotations of the X-cut. Plots of the SAW properties of this cut are shown in FIG. 2. While FIG. 1 illustrates a lead potassium niobate substrate 10 with the Euler angles of this invention. The graphs of FIG. 2 show that there are a series of attractive independent SAW orientations for the X cut. As example, orientations having the Euler angle $\theta$ equal to $-10.6°$, $0°$ and $+10.6°$ are listed in Table I with respective values for temperature coefficient of time delay (TCD), electromechanical power flow angle and its slope, piezoelectric coupling constant ($\Delta V/V\infty$), and SAW velocity. For comparison, the ST cut of quartz, two orientations of berlinite, AlPO$_4$, and two of thallium vanadium sulfide, Tl$_3$VS$_4$, are included also.

TABLE I

| Material | Orientation | Euler Angles λ | μ | θ | TCD (ppm/°C.) | Pow. Flow Ang. θ (deg.) | Slp. of Power Flw. Angle ($\partial\phi/\partial\theta$) | $\Delta V/V_\infty$ × $10^{-2}$ | SAW Velocity (m/sec) |
|---|---|---|---|---|---|---|---|---|---|
| Lead potassium niobate (Pb$_2$KNb$_5$O$_{15}$) | X cut 0° | 90 | 90 | 0 | −12.9 | 0.0 | −0.302 | 0.99 | 2505 |
| | X cut ± 10.6° | 90 | 90 | 10.6 | 0.0 | −2.5 | — | 0.84 | 2493 |
| Quartz (SiO$_2$) | ST cut | 0 | 132.75 | 0 | 0.0 | 0.0 | 0.378 | 0.058 | 3158 |
| Berlinite (AlPO$_4$) | X-axis boule | 0 | 80.4 | 0 | 0.0 | 0.0 | 0.901 | 0.245 | 2751 |
| | boule 80.4° Doubly rotated (110) | 79.7 | 90 | 15.5 | 0.0 | 0.0 | 0.221 | 0.247 | 2758 |
| Thallium vanadium sulfide (Tl$_3$VS$_4$) | cut 70° (110) | −45 | 90 | 70 | 0.0 | −17.0 | — | 1.0 | 900 |
| | cylinder 24° | 45 | 24 | 90 | 0.0 | 0.0 | — | 0.617 | 1010 |

As the data in Table I shows, each of these new cuts of PKN possesses the desirable combination of a small TCD and a small electromechanical power flow angle. Note that for the Euler angle $\theta = 10.6°$ the TCD is zero while the electromechanical four flow angle is small but nonzero; alternatively, for the Euler angle $\theta = 0.0°$, the TCD is small but nonzero while the electromechanical four flow angle is zero. All orientations having intermediate $\theta$ Euler angles possess a tradeoff of these properties. Most significant, however, is the fact that the piezoelectric coupling constants of these cuts are up to 17 times as large as that of the ST cut of quartz. It is known that, for a given amount of insertion loss, the maximum attainable fractional bandwidth of a SAW device is proportional to the square root of the $\Delta V/V_\infty$ coupling constant; hence, the large coupling of PKN makes feasible the development of temperature-compensated SAW devices with up to four times the fractional bandwidth possible with ST-cut quartz, for an equal amount of insertion loss.

The largest coupling found for PKN is that of the X-cut 0° orientation which, as Table I shows, has a non-zero but reasonably small TCD. Hence, it can be seen from FIG. 1 that there is actually a series of attractive cuts whose TCD values vary from −12.9 ppm/° C. to zero and whose piezoelectric coupling constants decrease only slightly from 0.0099 as the Euler angle $\theta$ is varied plus or minus 10.6° from 0.0°.

Another attractive feature shown by Table I is that for one orientation, defined by Euler angle $\theta$ equal to 0.0°, the slope of the electromechanical power flow angle, $\partial\theta/\partial\theta$, lies between 0.0 and −1.0. According to SAW diffraction theory, the diffraction spreading for this orientation is less than that of an isotropic material. This is another distinct advantage of PKN over either quartz or berlinite.

As is the case with any new material, precise determination of the crystallographic orientations possessing the attractive combination of SAW properties discussed above awaits the availability of abundant supplies of larger single-crystal samples of PKN. Currently, a cracking problem, which occurs during the growth process, limits single crystals to dimensions of only several millimeters. Solution of this cracking problem will make it possible to obtain a more reliable set of material constants, calculate the temperature-compensated orientations more accurately, and construct devices to experimentally verify those calculations. Despite the need for greater accuracy in the locations of the temperature-compensated orientations, however, the data presented herein show clearly that the PKN substrate of this invention will make feasible the development of temperature-stable low-insertion-loss SAW devices with far broader bandwidth than that possible with quartz, and without the temperature control schemes necessary with lithium niobate.

While the invention has been described by reference to a particular embodiment, it should be understood that those modifications as encompassed within the scope of the appended claims are intended to be included herein.

What is claimed is:

1. A lead potassium niobate crystalline substrate member particularly adapted for use in acoustic wave devices which is characterized by having an acoustic wave propagation surface defined by a plane that substantially coincides with the Euler angles Lambda=90.0°, Mu=90.0° and a range of Theta from about −10.6° to −1.0° and from about +0.1° to +10.6°.

2. A substrate member in accordance with claim 1 wherein the Euler angle Theta=−10.6°.

3. A substrate member in accordance with claim 1 wherein said Euler angle Theta=+10.6°.

* * * * *